United States Patent
Palascak

(10) Patent No.: US 11,686,783 B2
(45) Date of Patent: Jun. 27, 2023

(54) FREQUENCY DETECTION ON SENSOR INTEGRATED CIRCUITS

(71) Applicant: Allegro Microsystems, LLC, Manchester, NH (US)

(72) Inventor: Jan Palascak, Ceska Trebova (CZ)

(73) Assignee: Allegro Microsystems, LLC, Manchester, NH (US)

( * ) Notice: Subject to any disclaimer, the term of this patent is extended or adjusted under 35 U.S.C. 154(b) by 400 days.

(21) Appl. No.: 16/944,509

(22) Filed: Jul. 31, 2020

(65) Prior Publication Data

US 2022/0034976 A1 Feb. 3, 2022

(51) Int. Cl.
G01R 33/00 (2006.01)
G01R 33/07 (2006.01)
G01R 33/06 (2006.01)
G01R 33/09 (2006.01)

(52) U.S. Cl.
CPC ........ *G01R 33/0023* (2013.01); *G01R 33/066* (2013.01); *G01R 33/077* (2013.01); *G01R 33/093* (2013.01); *G01R 33/096* (2013.01); *G01R 33/098* (2013.01)

(58) Field of Classification Search
CPC .............. G01R 33/0023; G01R 33/066; G01R 33/077; G01R 33/07; G01R 33/09; G01R 33/093; G01R 33/096; G01R 33/098
See application file for complete search history.

(56) References Cited

U.S. PATENT DOCUMENTS

| | | | |
|---|---|---|---|
| 9,500,723 B2* | 11/2016 | Sinanoglu | G01R 33/02 |
| 9,716,453 B2* | 7/2017 | Guo | G01D 5/145 |
| 9,851,416 B2* | 12/2017 | Scheller | G01P 21/02 |
| 11,307,267 B1* | 4/2022 | Polley | G01R 33/0035 |

OTHER PUBLICATIONS

Fernandez, et al., "Typical Bearing Defects and Spectral Identification;" Power-MI; Retrieved from https://power-mi.com/content/typical-bearing-defects-and-spectral-identification; Jun. 8, 2017; 8 Pages.
Goertzel Algorithm retrieved from https://en.wikipedia.org/wiki/Goertzel_algorithm on Jan. 13, 2020; 4 Pages.
Goertzel, "An Algorithm for the Evaluation of Finite Trigonometric Series;" the American Mathematical Monthly, vol. 65, No. 1; Jan. 1958; 3 Pages.

(Continued)

*Primary Examiner* — Reena Aurora
(74) *Attorney, Agent, or Firm* — Daly, Crowley, Mofford & Durkee, LLP

(57) ABSTRACT

According to an embodiment of the present disclosure, an integrated circuit includes: at least one sensing element configured to generate a sensed signal responsive to an electrical or magnetic phenomenon; an analog-to-digital converter configured to convert the sensed signal into a digital signal; and a digital processor configured to detect a target frequency of the electrical or magnetic phenomenon by iteratively applying a first real-valued coefficient to samples of the digital signal using real-valued arithmetic.

26 Claims, 9 Drawing Sheets

(56) References Cited

OTHER PUBLICATIONS

Miljkovic, et al., "Brief Review of Motor Current Signature Analysis;" retrieved from https://www.researchgate.net/publication/304094187_Brief_Review_of_Motor_Current_Signature_Analysis on Jan. 1, 2015; 12 Pages.

Vitali, "The Goertzel Algorithm to Compute Individual Terms of the Discrete Fourier Transform (DFT);" retrieved from https://www.st.com/resource/en/design_tip/dm00446805-the-goertzel-algorithm-to-compute-individual-terms-of-the-discrete-fourier-transform-dft-stmicroelectronics.pdf; Dec. 3, 2017; 10 Pages.

U.S. Appl. No. 16/511,101, filed Jul. 15, 2019, Vuillermet, et al..

* cited by examiner

Continued Continued

FREQUENCY DETECTION ON SENSOR INTEGRATED CIRCUITS

BACKGROUND

Various types of sensors can be implemented using integrated circuits (ICs), including current sensors, proximity sensors, position sensors, speed sensors, and angle sensors. Such sensors may be used for controlling motor position and speed, among other applications. A sensor IC can include analog components for sensing electrical or magnetic phenomena, an analog to digital converter (ADC), and components configured to perform digital signal processing (DSP).

The Goertzel algorithm (also known as the Goertzel filter) is a DSP technique for efficient evaluation of the individual terms of the discrete Fourier transform (DFT). The Goertzel algorithm can analyze a selectable frequency component from a discrete signal in an iterative manner by applying a single real-valued coefficient at each iteration using real-valued arithmetic. An implementation of the Goertzel algorithm may be more numerically efficient than that of a DFT when computing only a select few frequency components out of a spectrum having many frequency components.

SUMMARY

Disclosed herein are embodiments of sensor integrated circuits (ICs), and related methods, configured to perform frequency detection on a digital signal using the Goertzel algorithm or a variation thereof. Disclosed embodiments can perform frequency detection in a numerically efficiently manner and can be provided within physically compact IC packages.

Disclosed embodiments can be used within various types of sensors, such as current sensors, power sensors, proximity sensors, etc. Applications of the disclosed subject matter include, but are not limited to, motor control systems, Motor Current Signature Analysis (MCSA), detecting ball bearing defects, detecting defects in a choke input filter (inductor), detecting defects in machine winding insulation, and detecting vibration on a speed sensor interface (e.g., within anti-lock braking systems).

According to one aspect of the present disclosure, an integrated circuit (IC) can include: at least one sensing element configured to generate a sensed signal responsive to an electrical or magnetic phenomenon; an analog-to-digital converter configured to convert the sensed signal into a digital signal; and a digital processor configured to detect a target frequency of the electrical or magnetic phenomenon by iteratively applying a first real-valued coefficient to samples of the digital signal using real-valued arithmetic and using a second real-valued coefficient.

In some embodiments, the IC can include a fault pin, wherein the digital processor is further configured to apply a voltage to the fault pin based on the detection of the target frequency. In some embodiments, the IC can have a programmable memory configured to store the target frequency. In some embodiments, the target frequency can be specified by the first real-valued coefficient and the second real-valued coefficient. In some embodiments, detecting the target frequency of the electrical or magnetic phenomenon includes generating a real part value and an imaginary part value. In some embodiments, the digital processor may be configured to detect the target frequency of the electrical or magnetic phenomenon by calculating a Euclidean norm of a vector defined by the real part value and the imaginary part value and comparing the norm of the vector to a predetermined threshold value.

In some embodiments, detecting the target frequency of the electrical or magnetic phenomenon can include generating a real part value but not an imaginary part value. In some embodiments, the digital processor may be configured to detect the target frequency of the electrical or magnetic phenomenon by comparing the real part value to a predetermined threshold value. In some embodiments, the digital processor can be configured to detect a plurality of target frequencies of the electrical or magnetic phenomenon by iteratively applying a respective plurality of real-valued coefficients to the samples of the digital signal using real-valued arithmetic. In some embodiments, the at least one sensing element can include a magnetic field sensing element configured to generate the sensed signal responsive to a magnetic field, wherein the digital processor is configured to detect the target frequency of the magnetic field. In some embodiments, the IC can include an analog front end configured to perform at least one of filtering, gain adjustment, or temperature compensation on the sensed signal.

According to one aspect of the present disclosure, a method can include: receiving a sensed signal generated by a sensing element on an integrated circuit, the sensed signal responsive to an electrical or magnetic phenomenon; converting, by an analog-to-digital converter on the integrated circuit, the sensed signal into a digital signal; and detecting, by a digital processor on the integrated circuit, a target frequency of the electrical or magnetic phenomenon by iteratively applying a first real-valued coefficient to samples of the digital signal using real-valued arithmetic and using a second real-valued coefficient.

In some embodiments, the method can include applying a voltage to a fault pin on the integrated circuit based on the detection of the target frequency. In some embodiments, the method can include accessing the target frequency from a programmable memory on the integrated circuit. In some embodiments, the target frequency may be specified by the first real-valued coefficient and the second real-valued coefficient. In some embodiments, detecting the target frequency of the electrical or magnetic phenomenon can include generating a real part value and an imaginary part value. In some embodiments, detecting the target frequency of the electrical or magnetic phenomenon can include: calculating a Euclidean norm of a vector defined by the real part value and the imaginary part value; and comparing the norm of the vector to a predetermined threshold value. In some embodiments, detecting the target frequency of the electrical or magnetic phenomenon includes generating a real part value but not an imaginary part value. In some embodiments, detecting the target frequency of the electrical or magnetic phenomenon can include comparing the real part value to a predetermined threshold value.

In some embodiments, detecting the target frequency of the electrical or magnetic phenomenon can include detecting a plurality of target frequencies of the electrical or magnetic phenomenon by iteratively applying a respective plurality of real-valued coefficients to the samples of the digital signal using real-valued arithmetic. In some embodiments, receiving the sensed signal generated by a sensing element can include receiving a magnetic field signal generated by a magnetic field sensing element, wherein detecting the target frequency of the electrical or magnetic phenomenon comprises detecting a frequency of the magnetic field. In some embodiments, the method can include performing at least one of the following by an analog front end of the integrated circuit: filtering the sensed signal; adjusting a gain of the sensed signal; or performing temperature compensation on the sensed signal.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

Figure 1:
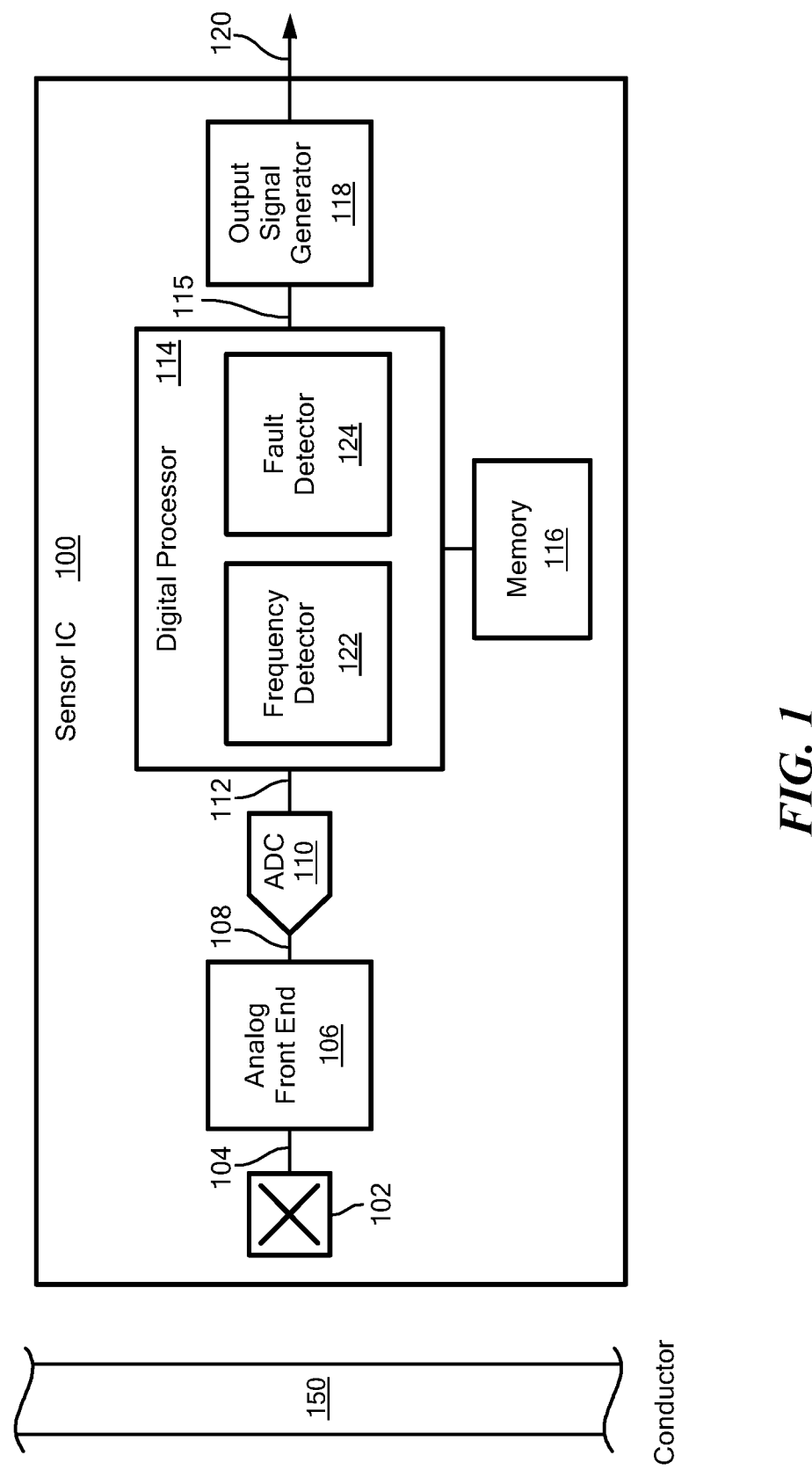
FIG. 1 is a block diagram of a sensor integrated circuit (IC) including a frequency detector and an optional fault detector, according to embodiments of the present disclosure.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "sensing element" is used to describe a variety of electronic elements that can sense electrical or magnetic phenomena including but not limited to electric current, electric charge/voltage, electric field, and magnetic field.

As used herein, the term "magnetic field sensing element" is used to describe a variety of electronic elements that can sense a magnetic field and generate a magnetic field signal responsive thereto. The magnetic field sensing element can be, but is not limited to, a Hall-effect element, a fluxgate, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Other non-limiting examples of sensing elements include optical sensing elements (e.g. photoresistors, photodiodes) and vibration sensing elements (e.g. piezoelectric accelerometers, MEMS).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

Referring to FIG. 1, an illustrative sensor integrated circuit (IC) 100 includes one or more sensing elements 102, an analog front end 106, an analog-to-digital converter (ADC) 110, a digital processor 114, an optional memory device 116, and an output signal generator 118.

Sensing elements 102 can be configured to sense an electrical or magnetic phenomenon and to generate a sensed signal 104 responsive thereto on signal path (or "line") 104. To promote clarity in the drawings, signal paths and the corresponding signals carried thereon are referred to herein using the same reference numbers. As shown in FIG. 1, sensing elements 102 can sense a current flowing through a conductor 150. That is, FIG. 1 shows an example of a current sensing application. The current may be an alternating current (AC) having one or more frequency components (e.g., conductor 150 may correspond to a power supply for an AC motor). In some embodiments, sensing elements 102 may be provided as magnetic field sensing elements to sense a magnetic field about the conductor 150 due to the electric current.

The disclosed subject matter is not limited to current sensing applications. For example, in some embodiments, sensing elements 102 may be provided as magnetic field sensing elements to sense a magnetic field generated by one or more magnetic or ferromagnetic elements (e.g., ferromagnetic gear teeth) in proximity, position, speed, or angle sensor applications.

Analog front end 106 can receive the magnetic field signal 104 and may include analog circuit elements to perform filtering, gain/offset adjustment, temperature compensation, and/or other analog signal processing on the received signal to generate a processed analog signal 108. The circuit elements provided within analog front end 106 can be selected based on the requirements of a given sensor application.

ADC 110 can include conventional analog-to-digital conversion components to convert the processed analog signal 108 into a digital signal 112. The digital signal 112 may comprise a sequence of real values representing time-varying measurements of the sensed current or other electrical or magnetic phenomenon. For example, in the case where sensing elements 102 are provided as magnetic field sensing elements, digital signal 112 may comprise a sequence of values representing the magnitude of a magnetic field over time.

Digital processor 114 includes a frequency detector 122 and an optional fault detector 124. Frequency detector 122 can be configured to detect one or more predetermined frequency components within digital signal 112 in a numerically efficient manner, e.g., using only real-valued arithmetic. As used herein, the term "real-valued arithmetic" refers to arithmetic operations wherein the operands are real numbers. The predetermined frequency components (referred to herein as "target frequencies") can be selected according to the needs of a particular sensor application. For example, to detect anomalies a motor supply current, the target frequencies can be selected to include one or more sideband frequencies (e.g., harmonics) around the supply frequency. As another example, to detect bearing defects, the target frequencies can be selected to cover one or more spectral bands within which particular bearing problems are known to present a response (e.g., a first spectral band to detect imbalance and misalignment, a second spectra band to detect looseness, etc.).

A target frequency detected by frequency detector 122 may have the following form:

$$\omega_0 = 2\pi \frac{k}{N}, \tag{1}$$

where k indicates a "frequency bin" of the discrete Fourier transform (DFT) selected from the set of index numbers $k \in \{0,1,2,\ldots,N-1\}$, where N is the length of the DFT input sequence. As is known, the DFT transforms a sequence of N complex numbers $\{x_n\} := x_0, x_1, x_{N-1}$ into another sequence of complex numbers $\{X_n\} := X_0, X_1, \ldots, X_{N-1}$. With the DFT, each output $X_k$ is a complex value that encodes both amplitude and phase of a complex component, $e^{i 2\pi k n/N}$, of $x_n$.

Frequency detector 122 can generate frequency detection information for the one or more target frequencies. In more detail, frequency detector 122 can extract N samples from digital signal 122 to construct a sequence $x_n$ of length N and then pass the sequence through a Goertzel filter configured to detect a particular target frequency. The sequence length N can be selected according to the needs of a particular sensor application. In some embodiments, frequency detection information generated by detector 122 can include one or more real values that represent—or, in some embodiments, provide an estimate of—the amplitude of the target frequency component of digital signal 122.

In some embodiments, the frequency detection information generated by detector 122 can indicate which of the target frequencies are detected (or "present") in the digital signal 112 using a threshold comparison technique. In some embodiments, amplitude values detected by frequency detector 122 can be divided by N, and the quotient can be used within the threshold comparison. A detailed description of techniques and structures that can be implemented within frequency detector 122 are provided below in the context of FIGS. 2-4.

The target frequencies to be detected by frequency detector 122 can be programmed or hardwired within the sensor IC 100. For example, memory 116 can be provided as an EEPROM (electrically erasable programmable read-only memory) or other type of programmable memory onto which the target frequencies can be programmed. Similarly, the sequence length N can be programmed within memory 116 or hardwired. As used here, a "hardwired" target frequency refers to one that is a permanent feature of the sensor IC 100. A target frequency can be hardwired, for example, by means of permanently connected circuitry or read-only memory (ROM).

Within sensor IC 100, a target frequency can be specified or represented as pairs of coefficients $C_r$ and $C_i$:

$$C_r = \cos\left(2\pi \frac{k}{N}\right) \tag{2}$$

$$C_i = \sin\left(2\pi \frac{k}{N}\right) \tag{3}$$

The coefficients $C_r$ and $C_i$ are referred to herein as the real part coefficient and the imaginary part coefficient, respectively. The coefficients $C_r$ and $C_i$ may be referred to as "real-valued coefficients" because they are defined in terms of real numbers. These coefficients can be used to detect the target frequency in a numerically efficient manner, as discussed further below.

In some embodiments, the coefficients $C_r$ and $C_i$ and/or the sequence length N can be stored as sixteen-bit unsigned integer values. In some embodiments, frequency detection can be performed using only the real part coefficient $C_r$, thereby reducing storage requirements of the sensor IC 100. This technique, which is discussed further in the context of FIG. 4, may lead to a significant reduction in the IC package size and/or cost where several target frequencies are detected.

In some embodiments, the target frequency can be programmed/hardwired as absolute frequency value, e.g., in Hertz, or as a normalized frequency value, e.g., in radians per sample such as in the form of equation (1). In this case, the coefficients $C_r$ and $C_i$ can be calculated during operation by digital processor 114 according to equations (2) and (3).

Fault detector 124 can receive frequency detection information from frequency detector 122 and, based thereon, can determine if there is a fault (e.g., a problem or unexpected condition within a machine utilizing sensor IC 100). In some embodiments, for each target frequency, fault detector 124 can compare the corresponding amplitude detected by fault detector 122 to a threshold value and, based on the comparison, can determine whether a fault occurred. For example, in a motor supply current sensor application, fault detector 124 can indicate a fault if (a) the supply frequency amplitude is less than a predetermined first threshold, or (b) a sideband frequency is greater than a predetermined second threshold. The thresholds used by fault detector 124 can be hardwired or programmed in memory 116. In some embodiments, a threshold (or multiple thresholds) can be defined for each target frequency. Fault detector 124 can be omitted in some embodiments.

Digital processor 114 can output, on line 115, the frequency detection information generated by frequency detector 122 and/or fault indications generated by fault detector 124. Output signal generator 118 can receive the digital processor output 115 and generate a sensor output signal 120 responsive thereto. The format of sensor output signal 120 can vary by sensor application.

In some embodiments, sensor IC 100 can include one or more fault pins that can be connected to a control board and other device. In such embodiments, output signal generator 118 can apply a DC voltage to a given fault pin in response to a fault indication by fault detector 124. That is, sensor output signal 120 may represent to one or more voltage signals applied to fault pins.

Figure 2:
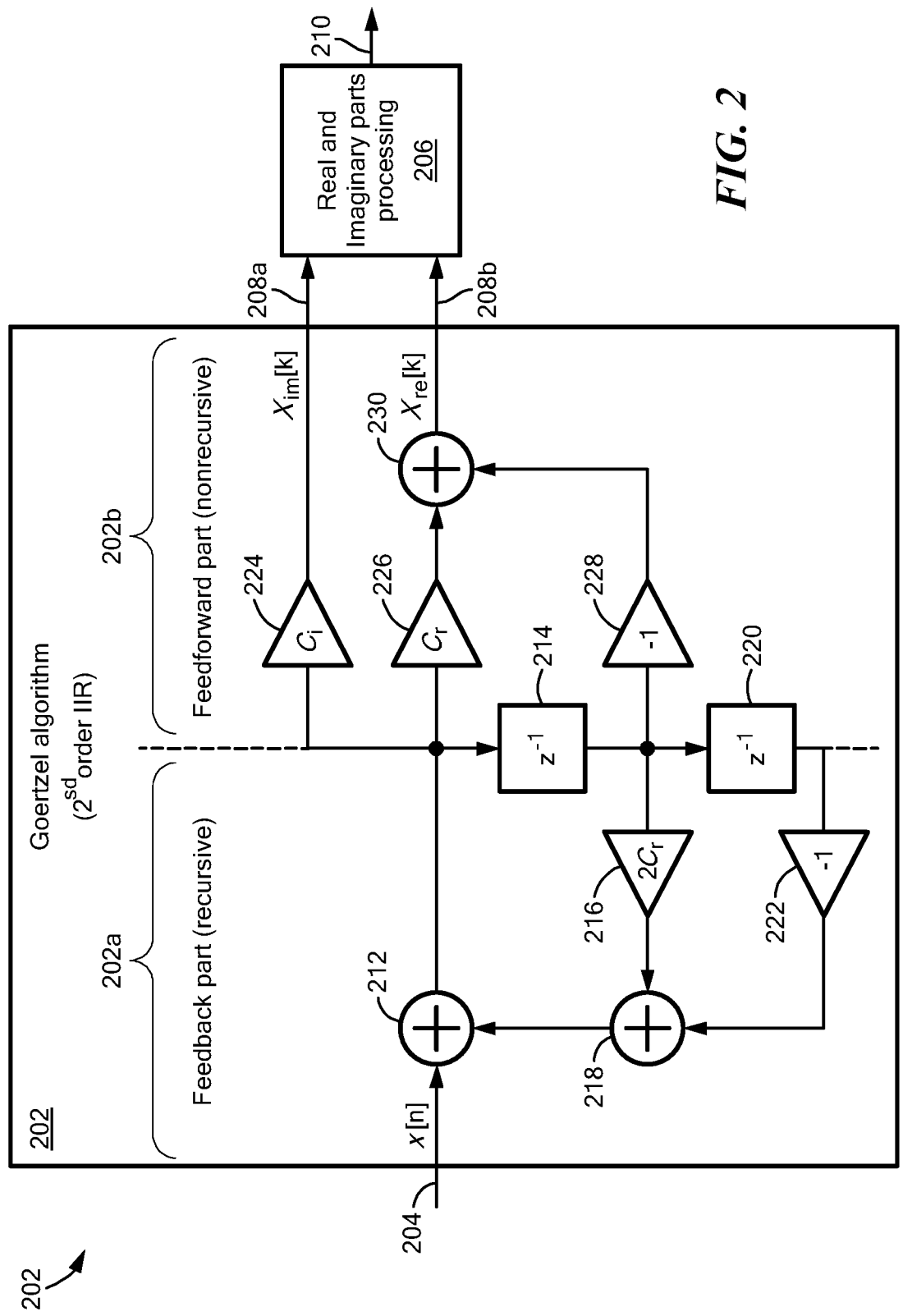
FIG. 2 is a schematic diagram of a frequency detector that can be implemented within the sensor IC of FIG. 1, according to embodiments of the present disclosure.

FIG. 2 shows an implementation of a frequency detector 200 that can be used, for example, within sensor IC 100 of FIG. 1, according to some embodiments. The illustrative frequency detector 200 includes a Goertzel filter 202 connected to an input 204, a real and imaginary parts processor (or "parts processor") 206 connected to Goertzel filter 202 via lines 208a and 208b, and an output 210 connected to parts processor 206. Input 204 can receive a digital signal (e.g., digital signal 112 of FIG. 1) corresponding a real-valued sequence $x_n$ of length N. As used herein, the term "real-valued sequence" refers to a sequence of real numbers.

As shown, the Goertzel filter 202 can be implemented as a second-order infinite impulse response (IIR) filter having a feedback part 202a and a feedforward part 202b. Feedback part 202a can include a first adder 212, a first delay 214, a first multiplier 216, a second adder 218, a second delay 220, and a second multiplier 222, which components can be connected together as shown. The multipliers shown in FIG. 2 can be implemented, for example, as amplifiers that operate to multiply the signal by a gain. First multiplier 216 can be configured to multiply its input by $2C_r$, where $C_r$ is the real part coefficient of the target frequency as defined in equation (2). Second multiplier 222 can be configured to multiply its input by negative one (−1). Delays 214 and 220 may be unit delays. The input of first adder 212 may correspond to decoder input 204, as shown.

Feedforward part 202b can include the first delay 214, the second delay 220, a third multiplier 224, a fourth multiplier 226, a fifth multiplier 228, and a third adder 230, which components can be connected together as shown. Third multiplier 224 can be configured to multiply its input by $C_i$, where $C_i$ is the complex part coefficient of the target frequency as defined according in equation (3). Fourth multiplier 226 can be configured to multiply its input by $C_r$, and fifth multiplier 228 can be configured to multiply its input by negative one (−1).

The output of third multiplier 224 and third adder 230 may be connected to parts processor 206 via lines 208a and 208b, respectively. In more detail, third multiplier 224 may output an imaginary part $X_{im}$ on line 208a and third adder 230 may output a real part $X_{re}$ on line 208b, where $X_{re}$ and $X_{im}$ are real values that encode amplitude and phase of a complex component, $e^{i2\pi kn/N}$, of input sequence $x_n$ where k is the DFT frequency bin corresponding to the target frequency.

The Goertzel filter 202 illustrated in FIG. 2 can be implemented using hardware components and/or software. For example, filter 200 can be implemented using the following code complied into executable computer program instructions:

```
function [Xre, Xim] = goertzel_example(x, N, Cr, Ci)
    z1 = 0;
    z2 = 0;
    for n = 1 : N
        z0 = x[n] + 2*Cr*z1 - z2;
        z2 = z1;
        z1 = z0;
    end
    Xre = Cr*z1 - z2;
    Xim = Ci*z1;
,
``` where the function parameters x, N, Cr, and Ci correspond, respectively, to $x_n$, N, $C_r$, and $C_i$ and the function outputs Xre and Xim correspond, respectively, to $X_{re}$ and $X_{im}$.

The outputs of the Goertzel filter, $X_{re}$ and $X_{im}$, can be processed by parts processor 206 to generate detector output 210. In some embodiments, parts processor 206 can calculate an amplitude of the target frequency component as the Euclidean norm of the vector $[X_{re}, X_{im}]$:

$$z = \sqrt{X_{im}^2 + X_{re}^2} \tag{4}$$

and the value z may be provided as the detector output 210. In some embodiments, the calculation of z can be avoided by using only the real part value $X_{re}$ for frequency detection, as discussed further below. In this case, processor 206 can be omitted along third multiplier 224 and line 208a. That is, line 208b may correspond to the detector output.

The frequency detector output 210 can be compared against one or more thresholds to detect a fault, as previously discussed. In some embodiments, the output 210 can be divided by the number of samples, N, and the quotient can be used for fault detection.

Frequency detector 200 can be used to detect different target frequencies by adjusting the coefficients $C_r$ and $C_i$. In some embodiments, frequency detector 200 can be used to detect multiple target frequencies in a serial or parallel manner. In the case of serial detection, a given input sequence $x_n$ can processed multiple times by the same detector 200, with coefficients $C_r$ and/or $C_i$ being changed for each frequency detection. In the case of parallel detection, multiple detectors 200 can be provided (e.g., in software or hardware), with different detectors configured to use different coefficients.

Figure 3:
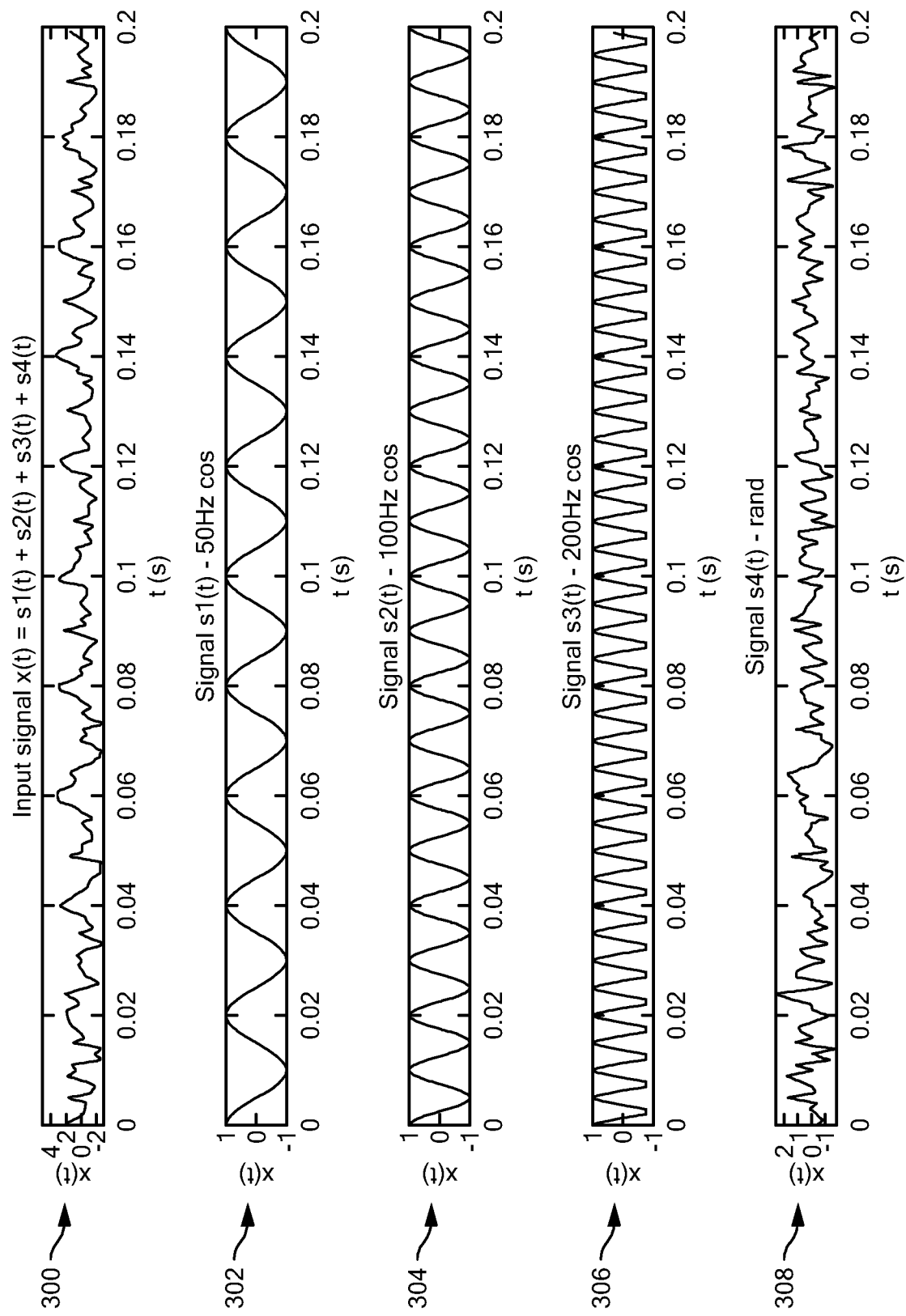
FIG. 3 shows a series of plots showing frequency components of an analog signal that can be provided as input to a sensor IC.

FIG. 3 shows an illustrative analog input signal 300 that can be provided as input to a sensor IC. For example, input signal 300 may correspond to sensed signal 104 of FIG. 1. Input signal 300 is the sum of a first sinusoidal signal 302 having a frequency of 50 Hz, a second sinusoidal signal 304 having a frequency of 100 Hz, a third sinusoidal signal 306 having a frequency of 200 Hz, and a random or noise signal 308.

Figure 3A:
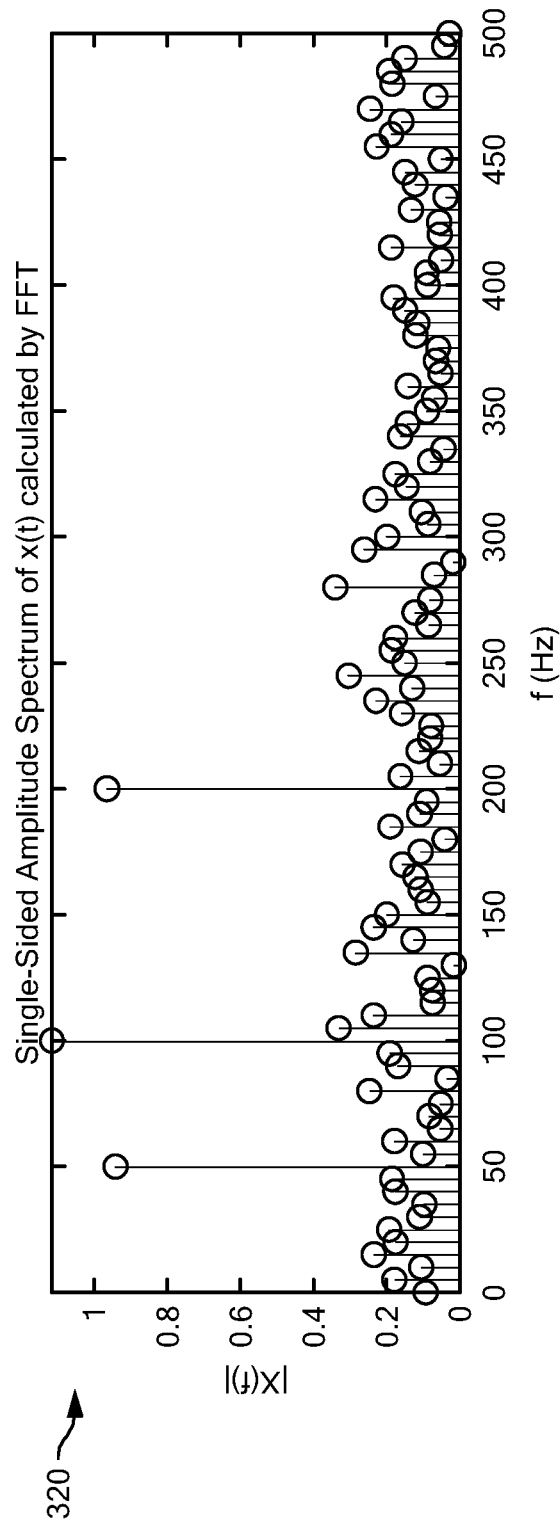
FIG. 3A is a plot of discrete frequency components for the analog signal of FIG. 3 calculated using a fast Fourier transform (FFT).
Figure 3B:
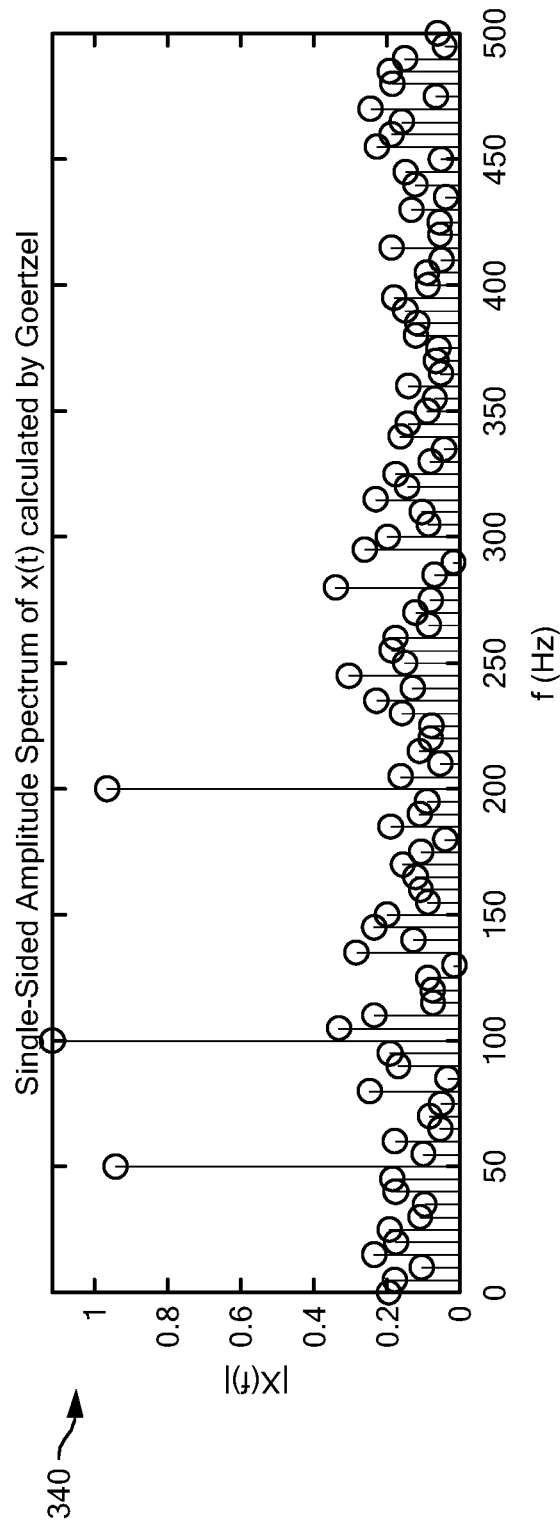
FIG. 3B is a plot of discrete frequency components for the analog signal of FIG. 3 calculated using a Goertzel algorithm.

FIGS. 3A and 3B show discrete frequency components of analog input signal 300 (FIG. 3) calculated using a fast Fourier transform (FFT) in plot 320 and the Goertzel algorithm in plot 340, respectively. It can be seen from these plots that the Goertzel algorithm and the FFT can produce the same results.

Figure 4:
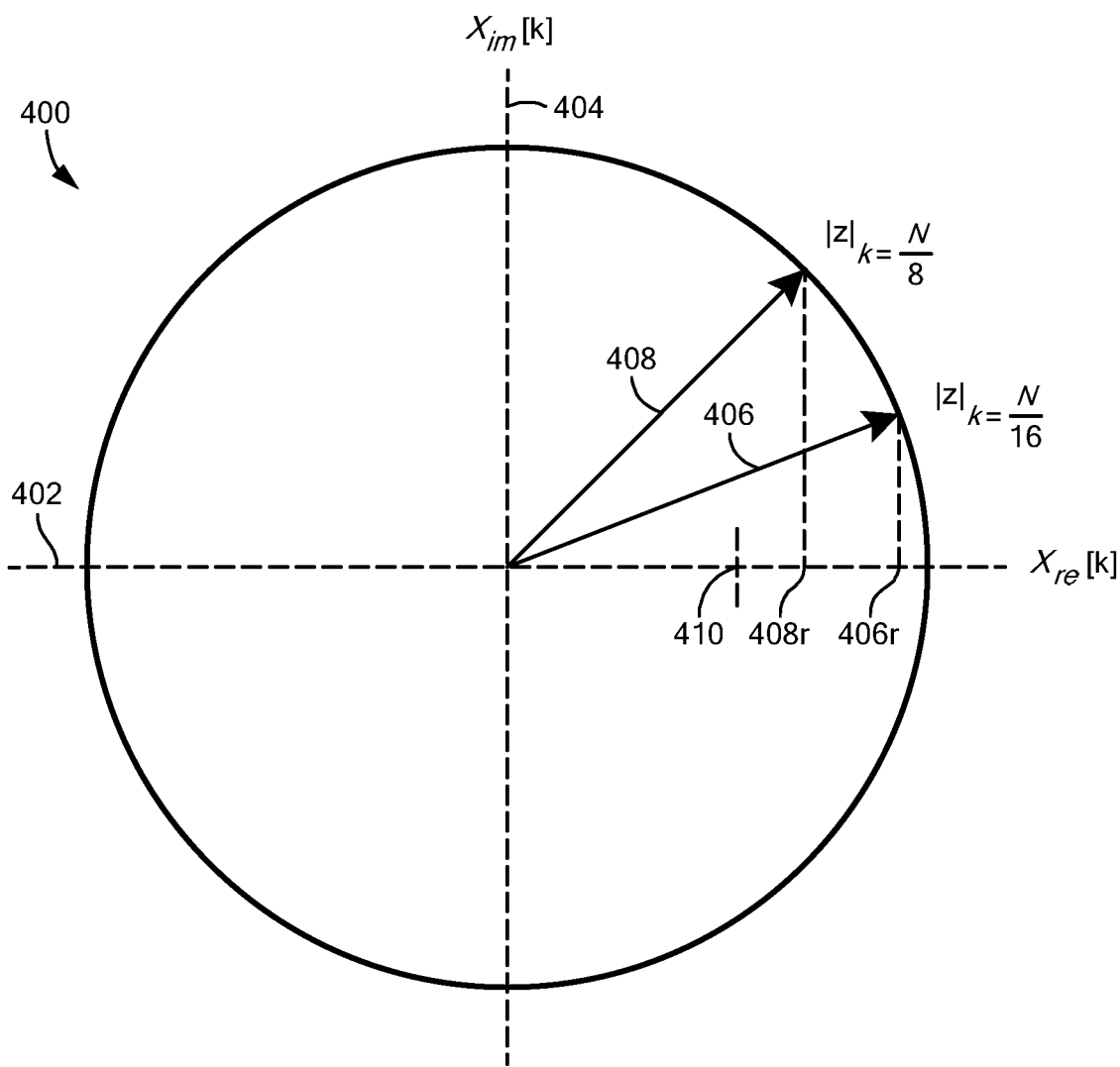
FIG. 4 is a diagram of a complex plane illustrating a technique for frequency detection using a threshold value, according to some embodiments.

Turning to FIG. 4, in some embodiments, frequency and/or fault detection can be performed using only the real part of the Goertzel filter output, $X_{re}$, without having to calculate z as in equation (4). This is illustrated in FIG. 4 using a complex plane 400 having a horizontal axis 402 corresponding to the real part of the Goertzel filter output, $X_{re}$, and a vertical axis 404 corresponding to the imaginary part of the Goertzel filter output, $X_{im}$.

A first vector 406 may correspond to the output of the Goertzel filter for target frequency $$k = \frac{N}{16}$$

and may have a real part value 406r as shown. A second phasor 408 may correspond to the output of the Goertzel filter for target frequency $$k = \frac{N}{8}$$

and may have a real part value 408r. A threshold value 410 can be selected along the real axis 402 according to the needs of a particular sensor application. If the real part of the Goertzel filter output, $X_{re}$, is greater than the threshold value 410, then a determination can be made that the corresponding target frequency is detected and, in turn, a fault determination can be made. In some embodiments, the real part output of the Goertzel filter, $X_{re}$, may be divided by N before comparing to the threshold.

It is appreciated herein that performing frequency/fault detection by directly comparing $X_{re}$ or $X_{im}$ to a threshold value (i.e., without calculating z) can reduce the number and complexity of operations performed by a digital processor (e.g., digital processor 114 of FIG. 1). In particular, calculating a square root—as in equation (4)—on an IC can be expensive in terms of silicon area and/or processor cycles. Moreover, in the case where only the real part value $X_{re}$ is used for frequency/fault detection, it is not necessary to calculate or store imaginary part coefficient $C_i$ for a given target frequency. That is, it is sufficient to calculate/store a single coefficient, $C_r$, per target frequency.

In some embodiments, this threshold-based detection technique illustrated in FIG. 4 can be used for target frequencies less than or equal to $$k = \frac{N}{8} \text{ or } k = \frac{N}{16}.$$

For higher frequencies (i.e., frequency bins greater than $$\frac{N}{8} \text{ or } \frac{N}{16}),$$

the modulus calculation or equation (4) can be used for frequency/fault detection.

Figure 5:
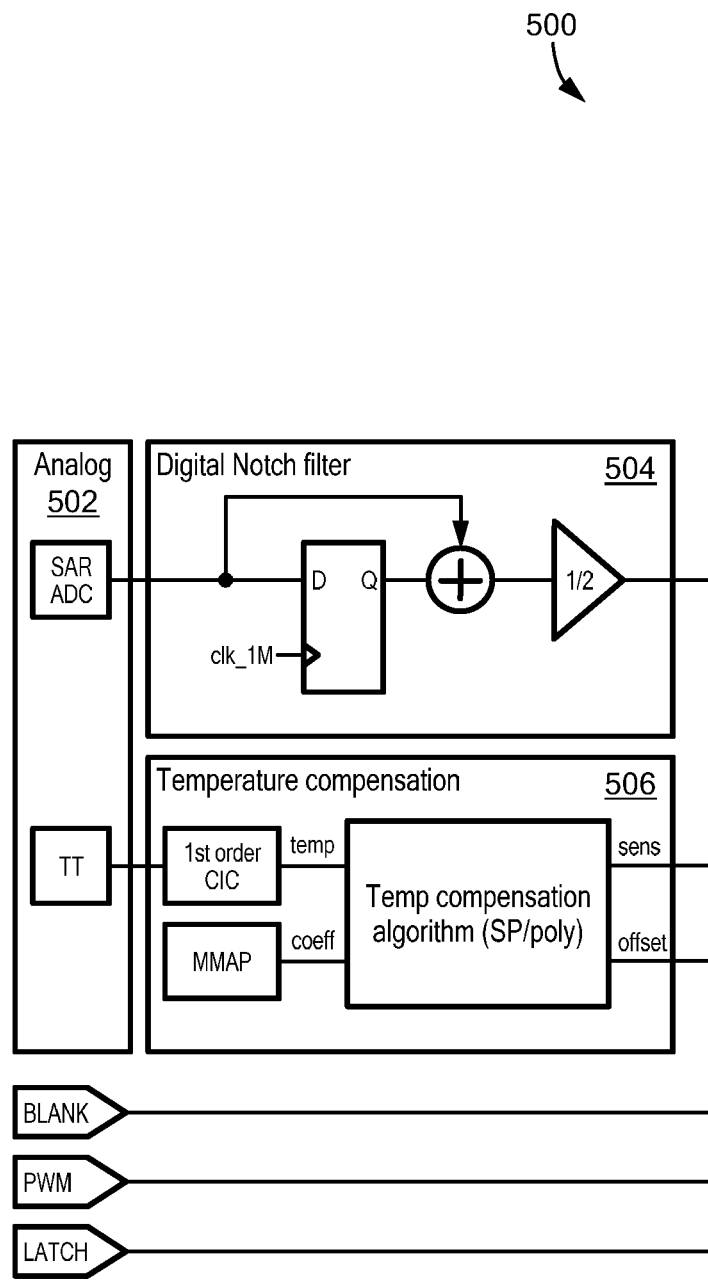
FIG. 5 is a block diagram of a digital current sensor configured to perform frequency detection, according to embodiments of the present disclosure.
Figure 5:
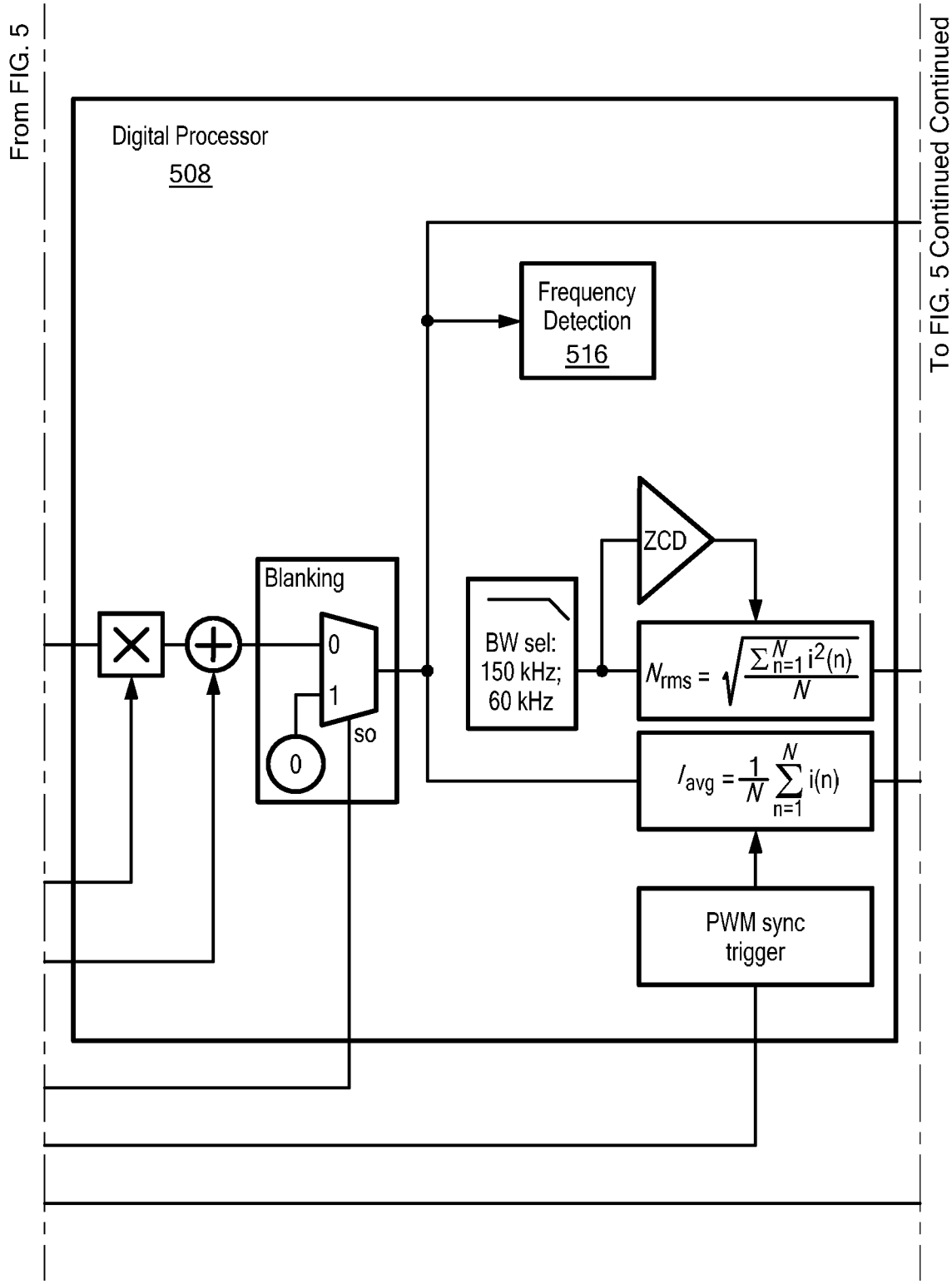
Figure 5:
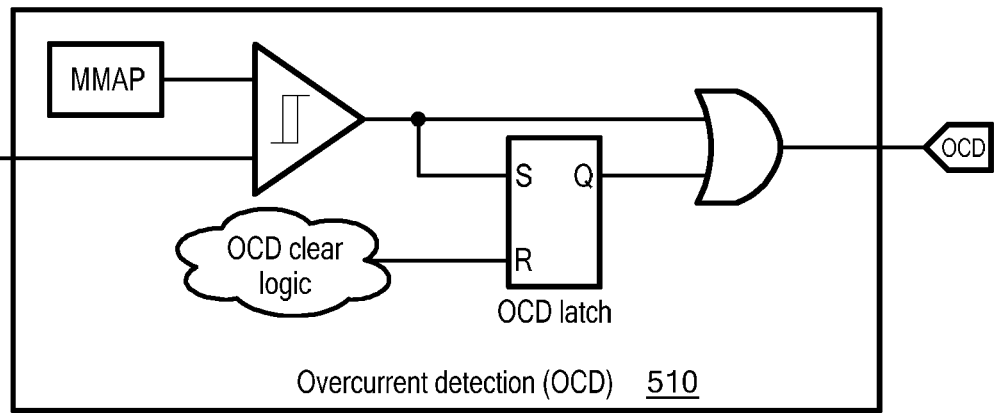
Figure 5:
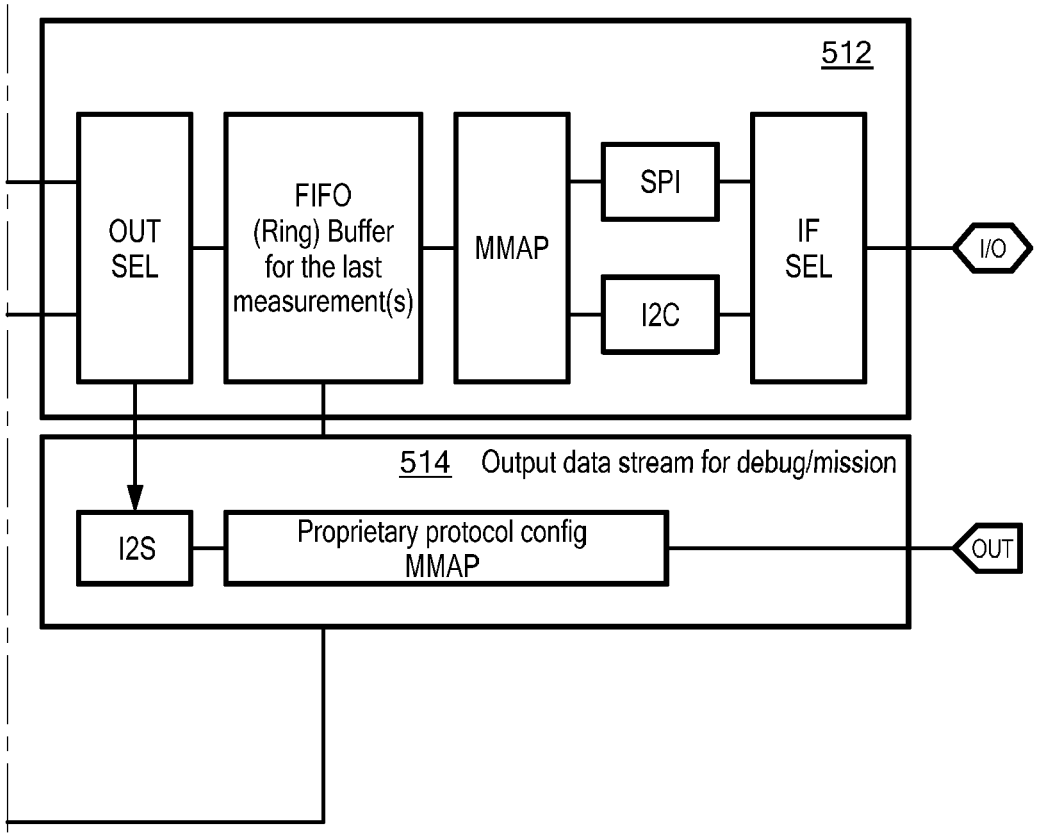

Turning to FIG. 5, the numerically efficient frequency detection techniques disclosed herein can be implemented with the digital processing resources found on existing sensor ICs. It is recognized herein the existing sensor ICs may have unused capacity, e.g., in terms of memory capacity or DSP capacity such as unused multiply-accurate (MAC) units. Taking advantage of such unused capacity, frequency detection capability can be added to existing sensors (e.g., existing current sensor) using the numerically efficient techniques and implementations disclosed herein.

Referring to FIG. 5, an illustrative current sensor 500 can include analog circuitry 502, a digital notch filter 504, temperature compensation unit 506, a digital processor 508, an overcurrent detection unit 510, and input-output (I/O) unit 512, and debugging unit 514. The digital processor 508 can be configured to perform various signal processing including but not limited to blanking, bandwidth selection, zero-cross detection (ZCD), and average calculation. In addition, as illustrated by box 516, digital processor 508 can be configured to perform numerically efficient frequency detection as disclosed herein. For example, frequency detector 516 may be the same as or similar to frequency detector 122 of FIG. 1 or frequency detector 200 of FIG. 2. In some embodiments, frequency detector 516 may be connected to one or more fault pins (not shown) and configured to apply voltages thereto in response to detecting one or more target frequencies.

Figure 6:
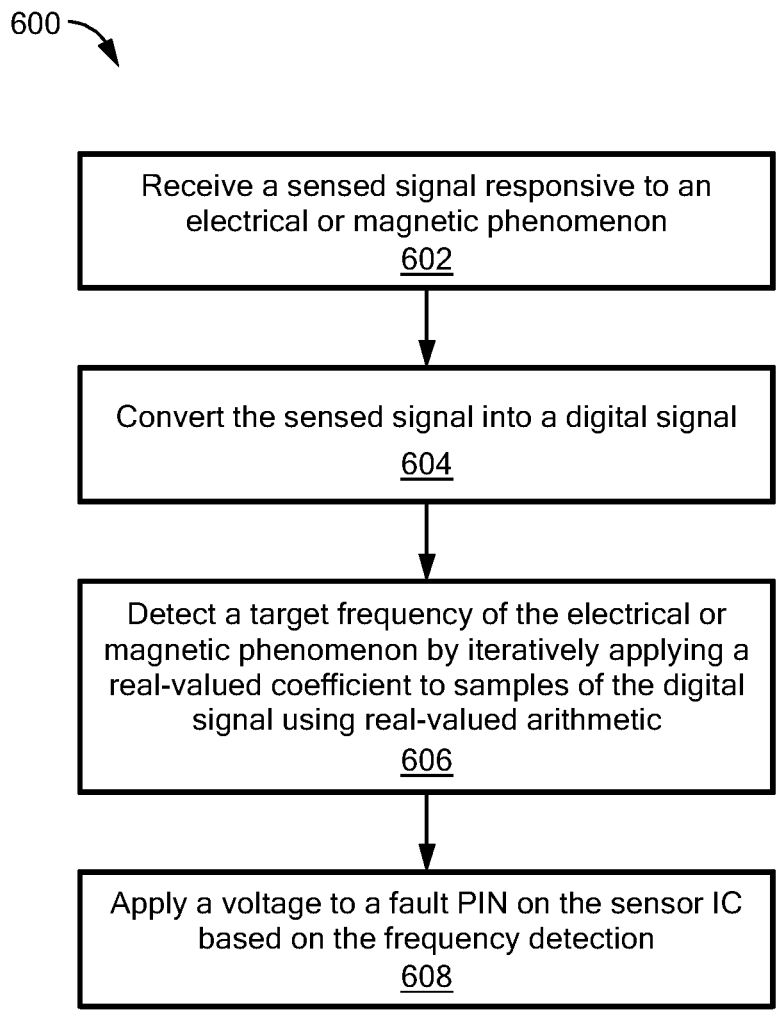
FIG. 6 is a flow diagram showing methods for frequency detection that can be implemented within a sensor IC, according to embodiments of the present disclosure.

FIG. 6 is a flow diagram showing illustrative processing that can be implemented within a sensor IC, such as sensor IC 100 of FIG. 1. In the flow diagram, blocks can represent steps performed by circuits such as a digital signal processor (DSP) circuit or an application specific integrated circuit (ASIC). The particular sequence of blocks described is illustrative only and can be performed in any convenient or desirable order.

Referring to FIG. 6, an illustrative method 600 can be used to detect a target frequency on a sensor IC in a numerically efficient manner. The target frequency can be specified in terms of real-valued coefficients $C_r$ and $C_i$ according to equations (2) and (3) above. The coefficients can be stored in programmable memory on hardwired on the sensor IC.

At block 602, a sensed signal generated by a sensing element on the IC can be received. The sensed signal can be responsive to an electrical or magnetic phenomenon, such as electrical current, electrical charge/voltage, or a magnetic field. In some embodiments, the sensing element can be a magnetic field sensing element.

In some embodiments, the sensor IC may have an analog front end to process the sensed signal. For example, method 600 can include filtering the sensed signal, adjusting a gain of the sensed signal, or performing temperature compensation on the sensed signal.

At block 604, the sensed signal may be converted to a digital signal by an analog-to-digital converter on the integrated circuit, the sensed signal into a digital signal. The digital signal can be sampled to generate real-valued sequences of length N used for frequency detection, as discussed next.

At block 606, numerically efficient frequency detection can be performed on samples of the digital signal using the real-valued coefficients $C_r$ and $C_i$. In more detail, a digital processor on the integrated circuit can be configured to detect the target frequency component of the electrical or magnetic phenomenon by applying the coefficients to the samples of the digital signal using real-valued arithmetic. Said frequency detection can be implemented using an implementation of the Goertzel filter, such as implementation 202 described above in the context of FIG. 2.

The Goertzel filter may output a real part value, $X_{re}$, and an imaginary part value, $X_{im}$. In some embodiments, the method 600 can detect the target frequency by calculating a Euclidean norm, z, of a vector defined by the real and imaginary part values as shown in equation (4), and comparing the calculated norm a predetermined threshold value.

In some embodiments, frequency detection can be performed using only a single real-valued coefficient (e.g., $C_r$). In this case, the real part of the Goertzel filter output, $X_{re}$, can be directly compared to a predetermined threshold value to detect of the target frequency component within the electrical or magnetic phenomenon.

At block 608, in response to detecting the target frequency, a voltage can be applied to a fault pin on the sensor IC. For example, a fault condition can be determined if the output of the Goertzel filter is greater than, or less than, the predetermined threshold value.

The method 600 can be extended to detect a plurality of target frequencies in a serial or parallel manner, as discussed above in the context of FIG. 2. Thus, for example, method 600 can be used to detect anomalies a motor supply current, by selecting the target frequencies to include the supply (or "line") frequency and one or more sideband frequencies around the supply frequency.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments, it will now become apparent to one of ordinary skill in the art that other embodiments incorporating their concepts may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

The invention claimed is:

1. An integrated circuit comprising:
   at least one sensing element configured to generate a sensed signal responsive to an electrical or magnetic phenomenon;
   an analog-to-digital converter configured to convert the sensed signal into a digital signal; and
   a digital processor configured to detect a predetermined target frequency of the electrical or magnetic phenomenon by iteratively applying a first real-valued coefficient to samples of the digital signal using real-valued arithmetic and using a second real-valued coefficient, wherein the first and second real-valued coefficients correspond to results of cosine and sine functions, respectively, applied to the predetermined target frequency.

2. The integrated circuit of claim 1, further comprising a fault pin, wherein the digital processor is further configured to apply a voltage to the fault pin based on the detection of the predetermined target frequency.

3. The integrated circuit of claim 1, further comprising a programmable memory configured to store the predetermined target frequency.

4. The integrated circuit of claim 3, wherein the programmable memory is further configured to store the first and second real-valued coefficients.

5. The integrated circuit of claim 1, wherein the predetermined target frequency is specified by the first real-valued coefficient and the second real-valued coefficient.

6. The integrated circuit of claim 1, wherein detecting the predetermined target frequency of the electrical or magnetic phenomenon includes generating a real part value and an imaginary part value.

7. The integrated circuit of claim 6, wherein the digital processor is configured to detect the predetermined target frequency of the electrical or magnetic phenomenon by calculating a norm of a vector defined by the real part value and the imaginary part value and comparing the norm of the vector to a predetermined threshold value.

8. The integrated circuit of claim 1, wherein detecting the predetermined target frequency of the electrical or magnetic phenomenon includes generating a real part value but not an imaginary part value.

9. The integrated circuit of claim 8, wherein the digital processor is configured to detect the predetermined target frequency of the electrical or magnetic phenomenon by comparing the real part value to a predetermined threshold value.

10. The integrated circuit of claim 1, wherein the digital processor is configured to detect a plurality of target frequencies of the electrical or magnetic phenomenon by iteratively applying a respective plurality of real-valued coefficients to the samples of the digital signal using real-valued arithmetic.

11. The integrated circuit of claim 1, wherein the at least one sensing element comprises a magnetic field sensing element configured to generate the sensed signal responsive to a magnetic field, wherein the digital processor is configured to detect the predetermined target frequency of the magnetic field.

12. The integrated circuit of claim 1, further comprising an analog front end configured to perform at least one of filtering, gain adjustment, or temperature compensation on the sensed signal.

13. The integrated circuit of claim 1, wherein the predetermined target frequency is expressed in radians per sample.

14. A method comprising:
   receiving a sensed signal generated by a sensing element on an integrated circuit, the sensed signal responsive to an electrical or magnetic phenomenon;
   converting, by an analog-to-digital converter on the integrated circuit, the sensed signal into a digital signal; and
   detecting, by a digital processor on the integrated circuit, a predetermined target frequency of the electrical or magnetic phenomenon by iteratively applying a first real-valued coefficient to samples of the digital signal using real-valued arithmetic and using a second real-valued coefficient, wherein the first and second real-valued coefficients correspond to results of cosine and sine functions, respectively, applied to the predetermined target frequency.

15. The method of claim 14, further comprising applying a voltage to a fault pin on the integrated circuit based on the detection of the predetermined target frequency.

16. The method of claim 14, further comprising accessing the predetermined target frequency from a programmable memory on the integrated circuit.

17. The method of claim 16, further comprising accessing the first and second real-valued coefficients from the programmable memory.

18. The method of claim 14, wherein the predetermined target frequency is specified by the first real-valued coefficient and the second real-valued coefficient.

19. The method of claim 14, wherein detecting the predetermined target frequency of the electrical or magnetic phenomenon includes generating a real part value and an imaginary part value.

20. The method of claim 19, wherein detecting the predetermined target frequency of the electrical or magnetic phenomenon includes:
    calculating a norm of a vector defined by the real part value and the imaginary part value; and
    comparing the norm of the vector to a predetermined threshold value.

21. The method of claim 14, wherein detecting the predetermined target frequency of the electrical or magnetic phenomenon includes generating a real part value but not an imaginary part value.

22. The method of claim 21, wherein detecting the predetermined target frequency of the electrical or magnetic phenomenon includes comparing the real part value to a predetermined threshold value.

23. The method of claim 14, wherein detecting the predetermined target frequency of the electrical or magnetic phenomenon includes detecting a plurality of target frequencies of the electrical or magnetic phenomenon by iteratively applying a respective plurality of real-valued coefficients to the samples of the digital signal using real-valued arithmetic.

24. The method of claim 14, wherein receiving the sensed signal generated by a sensing element comprises receiving a magnetic field signal generated by a magnetic field sensing element, wherein detecting the predetermined target frequency of the electrical or magnetic phenomenon comprises detecting a frequency of the magnetic field.

25. The method of claim 14, further comprising performing at least one of the following by an analog front end of the integrated circuit:
    filtering the sensed signal;
    adjusting a gain of the sensed signal; or
    performing temperature compensation on the sensed signal.

26. The method of claim 14, wherein the predetermined target frequency is expressed in radians per sample.

* * * * *

UNITED STATES PATENT AND TRADEMARK OFFICE
CERTIFICATE OF CORRECTION

| | |
|---|---|
| PATENT NO. | : 11,686,783 B2 |
| APPLICATION NO. | : 16/944509 |
| DATED | : June 27, 2023 |
| INVENTOR(S) | : Jan Palascak |

It is certified that error appears in the above-identified patent and that said Letters Patent is hereby corrected as shown below:

In the Specification

Column 5, Line 54 delete ",$x_1$, $x_{N-1}$ into" and replace with --, $x_1, \ldots, x_{N-1}$ into--.

Signed and Sealed this
Twenty-first Day of May, 2024

Katherine Kelly Vidal
*Director of the United States Patent and Trademark Office*